(12) United States Patent  
Toyoda et al.

(10) Patent No.: US 7,241,639 B2
(45) Date of Patent: Jul. 10, 2007

(54) COLOR FILTER, MANUFACTURING METHOD THEREOF, ELECTROOPTICAL DEVICE AND ELECTRONIC EQUIPMENT

(75) Inventors: Naoyuki Toyoda, Suwa (JP); Tomomi Kawase, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 201 days.

(21) Appl. No.: 11/128,160

(22) Filed: May 13, 2005

(65) Prior Publication Data
US 2006/0008930 A1   Jan. 12, 2006

(30) Foreign Application Priority Data
Jul. 7, 2004   (JP)   ............... 2004-200557

(51) Int. Cl.
*H01L 21/00* (2006.01)
(52) U.S. Cl. ............... 438/70; 438/30; 438/704; 257/E21.017; 257/E21.218; 257/E1.527
(58) Field of Classification Search ............... 438/70, 438/30, 75, 77, 85, 93, 704, 707, 715, 758, 438/782, 513, 680
See application file for complete search history.

(56) References Cited
U.S. PATENT DOCUMENTS

| | | | |
|---|---|---|---|
| 5,658,697 A | * | 8/1997 | Lin .................. 430/7 |
| 5,863,233 A | * | 1/1999 | Porter et al. .......... 445/50 |
| 6,120,674 A | * | 9/2000 | Porter et al. ......... 205/640 |
| 6,613,486 B1 | * | 9/2003 | Ohtsu et al. ........... 430/7 |
| 7,148,148 B2 | * | 12/2006 | Mori et al. ........... 438/704 |

FOREIGN PATENT DOCUMENTS

| JP | A 2000-171628 | 6/2000 |
|---|---|---|
| JP | A 2000-187206 | 7/2000 |
| JP | A 2000-227513 | 8/2000 |
| JP | A 2000-258622 | 9/2000 |
| JP | A 2002-372921 | 12/2002 |

* cited by examiner

*Primary Examiner*—David Nhu
(74) *Attorney, Agent, or Firm*—Oliff & Berridge, PLC

(57) ABSTRACT

A method for manufacturing a color filter having a picture element part surrounded by a partition wall and provided in the plural number on a substrate including a step of forming the partition wall that has a lyophobic quality on the substrate, step of forming a lyophilic layer in the picture element part by applying a lyophilic liquid that develops the lyophobic quality to a substantially whole surface of the substrate on which the partition wall is formed all at once and a step of applying a droplet of colorant to the picture element part in which the lyophilic layer is formed.

9 Claims, 7 Drawing Sheets

F.G. 8A
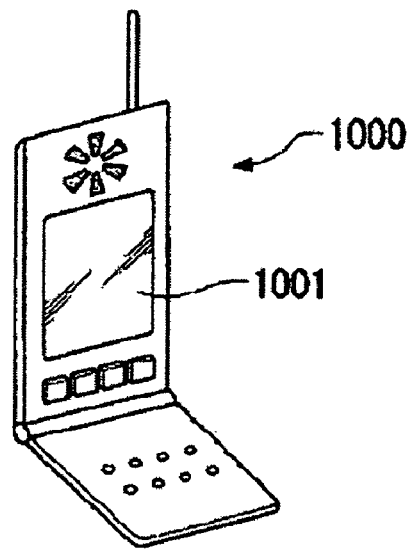
F.G. 8B
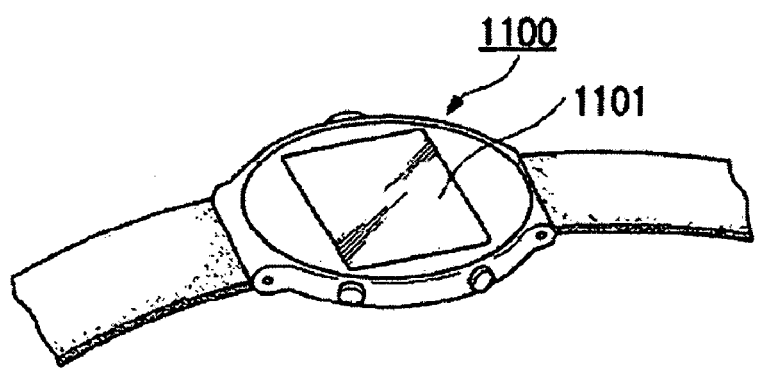
F.G. 8C
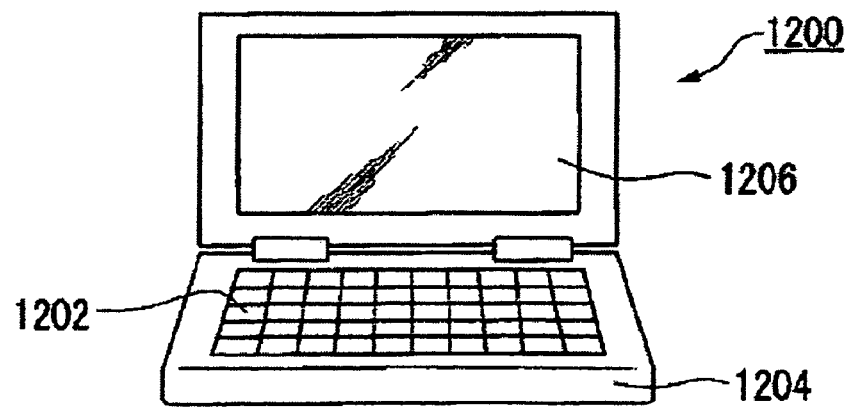

COLOR FILTER, MANUFACTURING METHOD THEREOF, ELECTROOPTICAL DEVICE AND ELECTRONIC EQUIPMENT

BACKGROUND OF THE INVENTION

1. Technical Field

The present invention relates to a color filter, a manufacturing method thereof, an electro-optical device and electronic equipment.

2. Related Art

When a color filter is manufactured by a droplet discharging method (an ink-jet method), droplets of a pigment (ink) are sequentially applied to each picture element which is surrounded by a partition wall called "bank". In this case, if the droplet is not spread evenly within the picture element, unevenness or color mixture surmounting the partition wall could occur. For this reason, the partition wall is required to have a lyophobic quality and the picture element is required to have a high lyophilic quality.

In order to give the lyophobic quality to the partition wall, a lyophobic photoresist has been used to form the partition wall. Japanese Unexamined Patent Publication No. 2002-372921 is a first example of related art. As described in the first example, a higher lyophobic quality than that of the picture element has been given to the partition wall by a plasma treatment using oxygen and a fluorocarbon gas. Japanese Unexamined Patent Publication No. 2000-227513 is a second example of related art. The second example describes a technique to perform patterning by using a lyophobic and lyophilic solution including photocatalyst and a fluorinated silicon material.

However, the following problem exists in the above-mentioned technique. In the technique, at least the lyophobic quality of the partition wall has to be secured in order to avoid the color mixture. Therefore, it was difficult to obtain a high wettability on the whole picture element, especially, in an area where is close to the partition wall within the picture element. As a result, a flat colored layer with an even thickness could not be obtained and it could lead to image quality deterioration.

Particularly, it has been recently considered to avoid a plasma treatment from the aspect of environmental concerns. When the plasma treatment is not used, the partition wall is formed by using the lyophobic photoresist without performing a process for giving the lyophilic quality to the picture element. This means the lyophobic property of the picture element depends on a lyophobic property which a substrate such as a glass substrate originally has. Thereby, it is also difficult to obtain enough wettability and spreadability.

SUMMARY

An advantage of the invention is to provide a color filter in which the high wettability can be obtained in the picture element, a manufacturing method thereof, an electrooptical device and electronic equipment.

According to a first aspect of the invention, a method for manufacturing a color filter having a picture element part surrounded by a partition wall and provided in the plural number on a substrate including a step of forming the partition wall that has a lyophobic quality on the substrate, step of forming a lyophilic layer in the picture element part by applying a lyophilic liquid that develops the lyophobic quality to a substantially whole surface of the substrate on which the partition wall is formed all at once and a step of applying a droplet of colorant to the picture element part in which the lyophilic layer is formed.

According to the first aspect of the invention, the droplet of the colorant applied to the substrate spreads out along the lyophilic layer even if the picture element part is not treated with a process to give the lyophilic quality such as a plasma treatment. Therefore, it is possible to obtain a flat and uniform colored layer in the picture element part.

In this case, the lyophilic liquid may be applied to the substrate all at once by a spin coat method.

In this way, it is possible to apply the lyophilic liquid to the picture element parts more easily and swiftly with simple equipment. The lyophilic liquid applied to the partition wall will be introduced into the picture element part since the partition wall has the lyophobic quality.

Furthermore, in this case, the lyophilic liquid may include a particle made of at least one substance selected from the group consisting of titanium oxide ($TiO_2$), zinc oxide (ZnO), tin oxide ($SnO_2$), strontium titanate ($SrTiO_3$), tungsten oxide ($WO_3$), bismuth oxide ($Bi_2O_3$) and iron oxide ($Fe_2O_3$). As the lyophilic liquid, a dispersion liquid of silica ($SiO_2$) may also be used.

For example, when the titanium oxide is contained in the lyophilic liquid, it is preferable that the plasma treatment is performed to the substrate and the lyophilic quality is given to the lyophilic layer. It is also preferable that the titanium oxide is supported by the lyophilic silica. With the lyophilic silica supported titanium oxide, it is not necessary to separately have the plasma treatment or exposure to ultraviolet rays and it is possible to improve production efficiency.

Moreover, it is preferable that the particle included in the lyophilic liquid has an average particle size of equal to or less than 1.0 μm.

When the titanium oxide is contained in the lyophilic liquid, it is preferable that an ultraviolet filter is formed on the substrate. In this way, the titanium oxide is prevented from being irradiated with the ultraviolet rays and it is prevented that the colorant receives adverse effect from the photocatalytic feature of the titanium oxide.

According to a second aspect of the invention, a color filter is manufactured by the above-described manufacturing method. Therefore, it is possible to obtain a color filter in which the flat and uniform colored layer is formed in the picture element part.

According to a third aspect of the invention, an electrooptical device includes the above-mentioned color filter and electronic equipment includes the electrooptical device.

Thereby, it is possible to easily form the flat and uniform colored layer with high precision and it makes it possible to obtain the electrooptical device and the electronic equipment with a high visibility and in which a microscopic patterning with a high-resolution is possible.

BRIEF DESCRIPTION OF THE DRAWINGS

The invention will be described with reference to the accompanying drawings, wherein like numbers refer to like elements, and wherein:

FIGS. 8A through 8C show embodiments of electronic equipment according to an aspect of the invention.

DESCRIPTION OF THE EMBODIMENTS

Embodiments of the invention, which is a color filter a manufacturing method thereof, an electrooptical device and electronic equipment, will now be described with reference to FIGS. 1 through 8.

Firstly, a liquid crystal device (electrooptical device) equipped with a color filter according to one embodiment of the invention will be described.

Here, an active matrix type liquid crystal device will be described as an example.

Figures 1A, 1B:
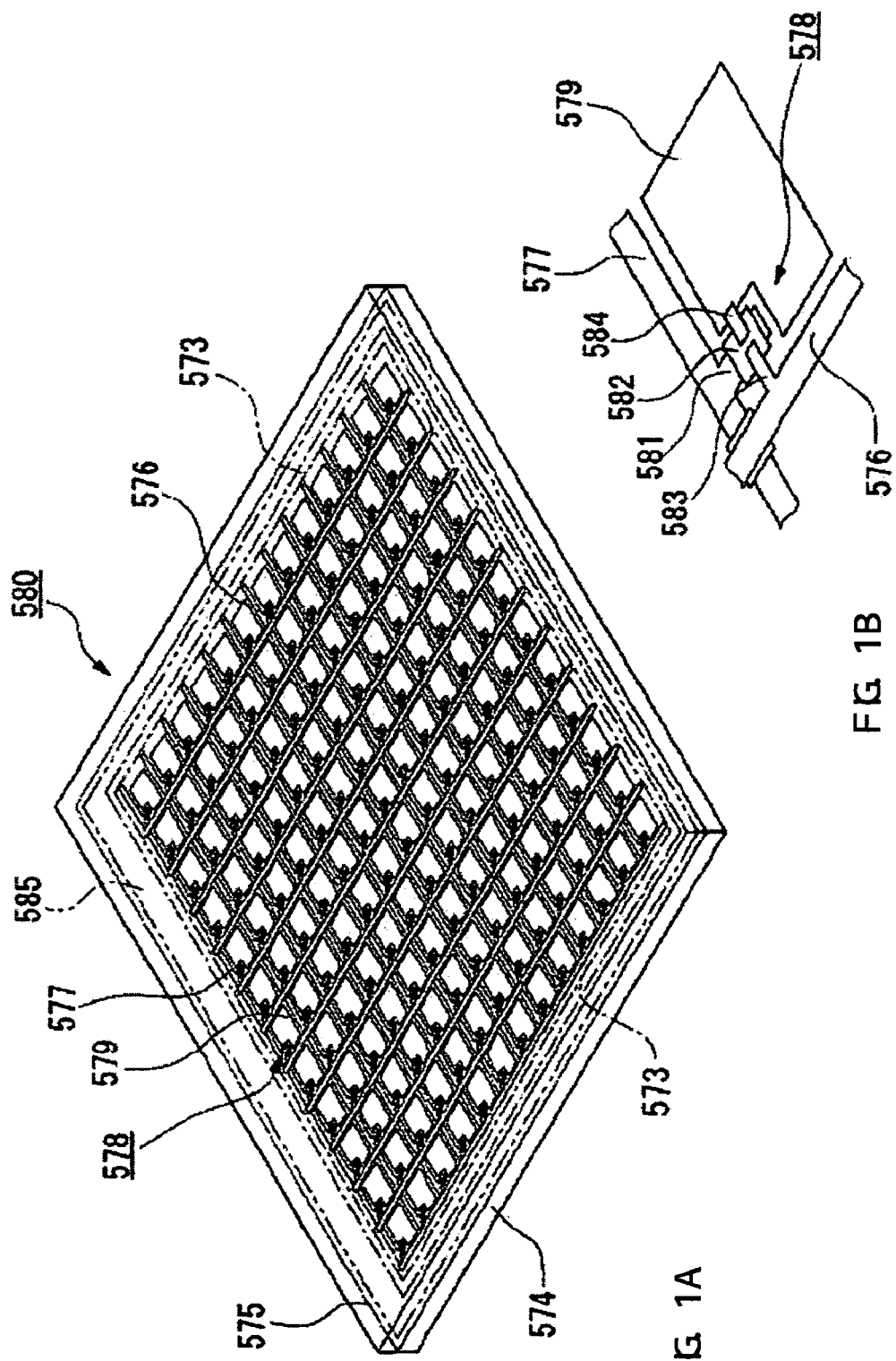
FIGS. 1A and 1B show an example of an active matrix type liquid crystal device (liquid crystal display device)

FIGS. 1A and 1B shows an example of the active matrix type liquid crystal device (liquid crystal display device) having a thin film transistor (TFT) as a switching element. FIG. 1A is a perspective view of this liquid crystal display device of the example showing its entire structure. FIG. 1B is an enlarged view of a picture element shown in FIG. 1A.

As shown in FIG. 1, a liquid crystal device 580 (electrooptical device) has an element substrate 574 on which a TFT element is formed and an opposing substrate 575 which opposes the element substrate 574. A sealant member 573 is provided in a frame-shape between the substrates 574 and 575. A liquid crystal layer (not shown in the figure) is enclosed in an area where is surrounded by the sealant member 573 between the substrates.

A source line 576 (data line) is provided in the plural number on a surface of the element substrate 574 which faces the liquid crystal. A gate line 577 (scan line) is also provided in the plural number on the surface of the element substrate 574. The source line 576 and the gate line 577 are provided so as to cross each other in a lattice-like pattern. A TFT element 578 is formed around each cross-point of the source line 576 and the gate line 577. A picture electrode 579 is coupled to the cross-point through each TFT element 578. The picture electrode 579 is provided in the plural number and arranged in a matrix in a plan view. On a surface of the opposing substrate 575 which faces the liquid crystal, a common electrode 585 is formed corresponding to a display region. The common electrode 585 is made of a transparent conductive material such as indium tin oxide (ITO).

As shown in FIG. 1B, the TFT element 578 includes a gate electrode 581 that extends from the gate line 577, an insulating layer (not shown in the figure) that covers the gate electrode 581 and a semiconductor layer 582 formed on the insulating layer. The TFT element 578 also includes a source electrode 583 which extends from the source line 576 coupled to a source region in the semiconductor layer 582 and a drain electrode 584 coupled to a drain region in the semiconductor layer 582. The drain electrode 584 in the TFT element 578 is coupled to the picture electrode 579.

Figure 2:
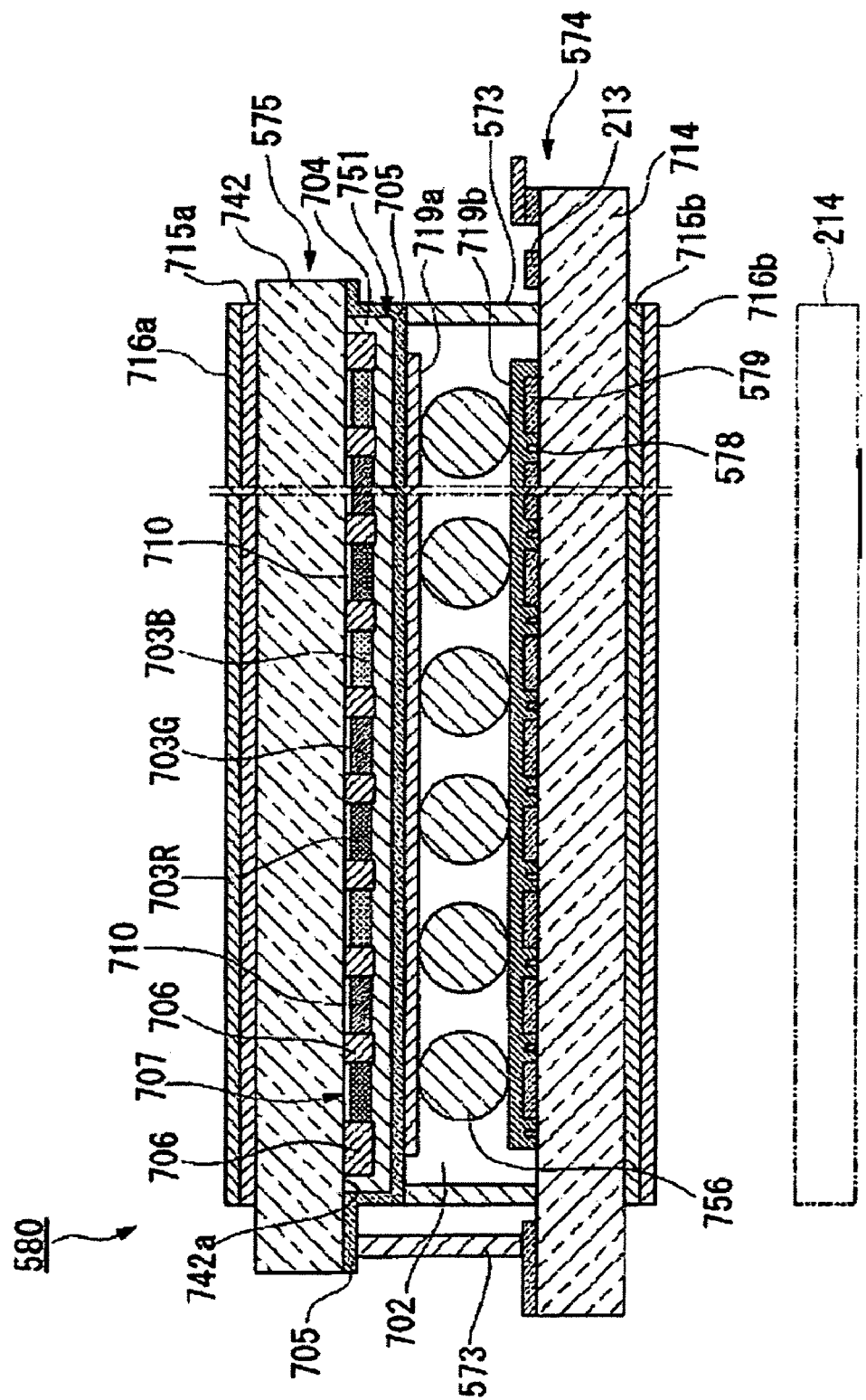
FIG. 2 is a sectional view of the active matrix type liquid crystal device showing its structure.

FIG. 2 is a sectional view of the active matrix type liquid crystal device (liquid crystal display device) showing its structure.

A liquid crystal device 580 is mainly composed of a liquid crystal panel. The liquid crystal panel includes the element substrate 574, the opposing substrate 575 that opposes the element substrate 574 and a liquid crystal layer 702 interposed therebetween. The liquid crystal panel also includes a retardation plate 715a attached to the opposing substrate 575, a polarization plate 716a, a retardation plate 715b attached to the element substrate 574 and a polarization plate 716b.

Furthermore, a driver integrated circuit (IC) 213 is provided on the element substrate 574. The driver IC supplies a driving signal to the liquid crystal layer 702. A back-light 214 is provided outside the polarization plate 716b. The back-light 214 serves as a light source for transmissive display. The liquid crystal device is completed as a finished product by attaching wires for electric signal transmission, accessories such as a supporting member and the like to the liquid crystal panel.

The opposing substrate 575 is mainly composed of a transparent substrate 742 made of quartz, glass and the like and a color filter 751 formed on the substrate 742. The color filter 751 includes a partition wall 706 that consists of a black-matrix, the bank and the like. The color filter 751 also includes colored layers 703R, 703G and 703B as filter elements, a lyophilic layer 710 and a protection film 704. The lyophilic layer 710 is interposed between the substrate 742 and the colored layers 703R, 703G and 703B. The protection film 704 is formed so as to cover the partition wall 706 and the colored layers 703R, 703G and 703B.

The partition wall 706 is formed so as to surround each filter element forming region 707 (picture element part) and formed in the lattice-like pattern on a face 742a of the substrate 742. The filter element forming region 707 is a colored layer forming region in which each of the colored layers 703R, 703G and 703B is formed.

The partition wall 706 is made of, for example, a black photosensitive resin. The black photosensitive resin includes at least, for example, a positive-type or negative-type photosensitive resin which is used for a normal photoresist and a black inorganic or organic pigment such as carbon black. In this embodiment of the invention, a lyophobic material such as fluoropolymer is used for the partition wall 706. The partition wall 706 contains the black inorganic or organic pigment and is formed in an area other than the formation area of the colored layers 703R, 703G and 703B. Therefore, the partition wall 706 can shut out a light traveling through the colored layers 703R, 703G and 703B and serves as a light shielding film.

The lyophilic layer 710 is made by applying a dispersion liquid (lyophilic liquid) in which a lyophilic transparent material such as lyophilic titanium oxide is dispersed in a dispersion medium such as alcohol and water. As a crystal pattern of the titanium oxide, an anatase type or a brookite type can be used. This titanium oxide holds a lyophilic material such as silica and it can maintain the lyophilic quality without being treated with the plasma treatment and the like.

The colored layers 703R, 703G and 703B are formed by introducing or discharging filter element materials (colorant) including red (R), green (G) and blue (B) to the filter element forming region 707 by the ink-jet method and then drying the materials. The filter element forming region 707 extends to an inner wall of the partition wall 706 and the substrate 724. As the filter element material, fluxing material of, for example, thermosetting acrylic resin, the organic pigment, diethylene glycol butyl ether derivatives and the like can be used.

Moreover, an electrode layer 705 for driving the liquid crystal is formed on the substantially whole surface of the protection film 704. The electrode layer 705 is made of the transparent conductive material such as ITO. An alignment film 719a is further provided so as to cover the electrode layer 705 for driving the liquid crystal. An alignment film 719b is provided on the picture electrode 579 which is provided on the side of the element substrate 574.

The element substrate 574 is composed of a transparent substrate 714 made of quartz, glass and the like, an unshown insulating layer formed on the substrate 714, the TFT element 578 and the picture electrode 579 formed on the insulating layer. As shown in FIG. 1, a plurality of the scan lines and a plurality of the signal lines are formed in the matrix on the insulating layer formed on the substrate 714. The picture electrode 579 is provided in each area where is surrounded by the scan line and the signal line. The TFT element 578 is embedded in a position where each picture electrode 579, the scan line and the signal line are electrically coupled. The TFT element 578 is switched ON or OFF depending on signals applied to the scan line and the signal line. This action becomes a power distribution control of the picture electrode 579. In this embodiment, the electrode layer 705 formed on the opposing substrate 575 is a full electrode which covers the whole picture element area. Various kinds of wiring circuits of the TFT and various shapes of picture electrodes may be applied in this embodiment.

The element substrate 574 and the opposing substrate 575 are adhered together with the sealant member 573 interposing some space therebetween. The sealant member 573 is formed along the periphery of the opposing substrate 575. Reference number 756 designates a spacer that is used in order to maintain a gap (cell gap) between the substrates uniform in a plane of the substrate. A rectangular liquid crystal enclosing region is partitioned and formed between the element substrate 574 and the opposing substrate 575 by the sealant member 573 that has substantially a frame shape in plan view. The liquid crystal is enclosed in this liquid crystal enclosing region.

Next, a droplet discharging device which is used to manufacture the above-described color filter 751 will be described.

Figure 3:
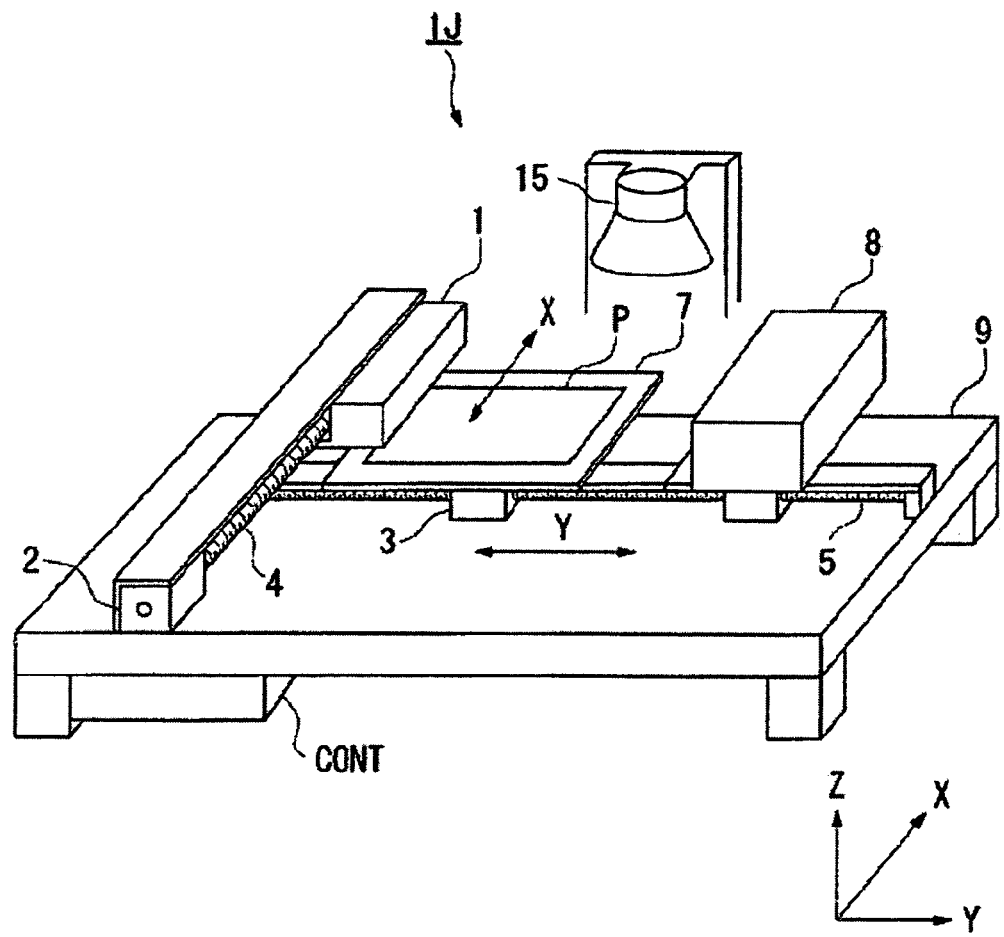
FIG. 3 shows an example of a droplet discharging device.

FIG. 3 is a perspective view of a droplet discharging device "IJ" schematically showing its structure.

The droplet discharging device IJ has a droplet discharge head 1, an X-way drive axis 4, a Y-way guide axis 5, a controller CONT, a stage 7, a cleaning mechanical section 8, a table 9 and a heater 15.

The stage 7 surmounts a substrate P to which ink (liquid material) is discharged by the droplet discharging device IJ. The stage 7 has an unshown feature to fix the substrate P in a reference position.

The droplet discharge head 1 is a multi-nozzle type head that is equipped with a plurality of discharge nozzles. A Y-axis direction corresponds to a longitudinal direction of the droplet discharge head 1. A nozzle is provided in the plural number on a lower face of the droplet discharge head 1. The nozzles align in the Y-axis direction and are provided with a regular space therebetween. From the nozzle of the droplet discharge head 1, the ink containing the above-referred colorant is discharged to the substrate on the stage 7.

An X-way driving mortar 2 is coupled to the X-way drive axis 4. The X-way driving mortar 2 is a stepping mortar and the like, and rotates the X-way drive axis 4 when an X-way driving signal is provided from the controller CONT. When the X-way drive axis 4 is rotated, the droplet discharge head 1 moves in an X-axis direction.

The Y-way guide axis 5 is fixed so as not to move against the table 9. The stage 7 has a Y-way driving mortar 3. The Y-way driving mortar 3 is a stepping mortar and the like.

When a Y-way driving signal is provided from the controller CONT, the Y-way driving mortar 3 moves the stage 7 in the Y-axis direction.

The controller CONT supplies a voltage for controlling discharge of the droplet to the droplet discharge head 1. The controller CONT also supplies a drive pulse signal for controlling an X-axis direction movement of the droplet discharge head 1 to the X-way driving mortar 2. The controller CONT also supplies a drive pulse signal for controlling a Y-axis direction movement of the stage 7 to the Y-way driving mortar 3.

The cleaning mechanical section 8 cleans the droplet discharge head 1. The cleaning mechanical section 8 has an unshown Y-directional driving mortar. The cleaning mechanical section 8 is driven by the driving mortar and moves along with the Y-way guide axis 5. This movement of the cleaning mechanical section 8 is also controlled by the controller CONT.

The heater 15 is used to perform a heat treatment to the substrate P by lamp anneal. Solvent contained in the liquid material applied to the substrate P will be evaporated and dried with the heater 15. Power on and off of this heater 15 is also controlled by the controller CONT.

The droplet discharging device IJ discharges a droplet to the substrate P as moving the droplet discharge head 1 and the substrate P relatively. Here, the X-axis direction is a scanning direction and the Y-axis direction which is perpendicular to the X-axis direction is a non-scanning direction in the following description. Accordingly, the discharge nozzles of the droplet discharge head 1 align in the Y-axis direction or the non-scanning direction with the regular space between two adjacent discharge nozzles. Though the droplet discharge head 1 is placed orthogonal to a traveling direction of the substrate P in FIG. 3, it may be placed so as to cross the traveling direction of the substrate P by adjusting an angle of the droplet discharge head 1. By adjusting the angle of the droplet discharge head 1, a pitch between the nozzles can be changed. Furthermore, a distance between the substrate P and a nozzle face may be discretionally adjusted.

Figure 4:
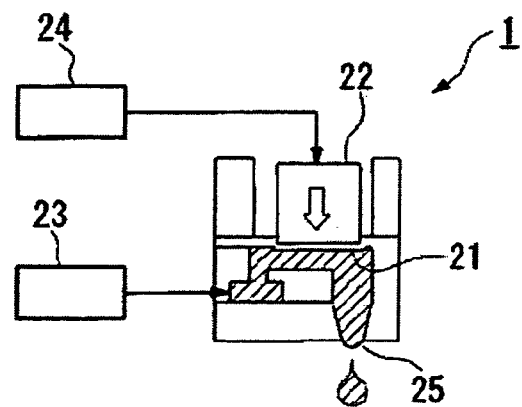
FIG. 4 is an explanatory drawing for explaining a discharging mechanism of a liquid material by a piezo method.

FIG. 4 is an explanatory drawing for explaining a discharging mechanism of the liquid material by a piezo method.

In FIG. 4, a piezo element 22 is provided adjacent to a liquid room 21 into which the liquid material goes. The liquid material is supplied to the liquid room 21 through a liquid material supply system 23 including a material tank that stores the liquid material. The piezo element 22 is coupled to a driving circuit 24. Voltage is applied to the piezo element 22 through the driving circuit 24 and the piezo element 22 is deformed. The liquid room 21 is deformed by the deformation of the piezo element 22 and the liquid material is discharged from a nozzle 25. In this case, a degree of distortion of the piezo element 22 is controlled by changing a value of the applied voltage. A distortion speed of the piezo element 22 is controlled by changing a frequency of the applied voltage. As for a method of discharging droplets, a bubble (thermal) method is adaptable. In the bubble method, the liquid material is heated so as to make bubbles and the liquid material is discharged by the bubbles. Meanwhile, in the piezo method, the material will not be heated. Therefore, there is an advantage that composition of the material is hardly affected with the piezo method.

Next, procedure of manufacturing the color filter 751 by using the above-mentioned droplet discharging device IJ will be described. FIG. 5 and FIG. 6 are explanatory drawings for explaining an example of the manufacturing method of the color filter 751.

Figure 5A:
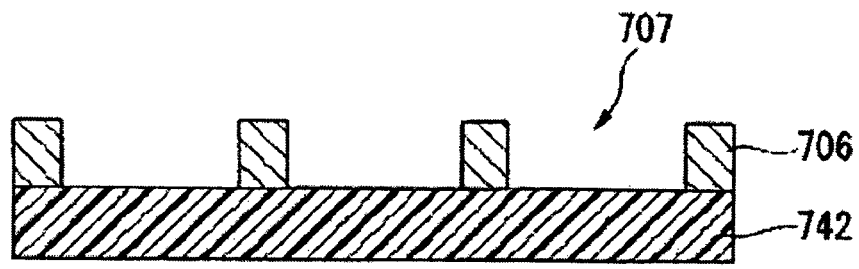
FIGS. 5A through 5C are schematically showing a manufacturing method of the liquid crystal device.

Firstly, the partition wall 706 (black matrix) is formed on one face of the transparent substrate 742 as shown in FIG. 5A. To form this partition wall 706, an opaque resin (preferably a black resin) is applied in a predetermined thickness (for example, about 2 μ) by a spin coat method and the like. Then, patterning is performed by using a photolithography technique or an ink-jet process.

When the lithography method is adopted, the organic material is applied in accordance with the height of the partition wall by a certain method such as spin coating, spray coating, roll coating, die coating, dip coating, bar coating, slit coating and the like. A resist layer is then applied thereon. A mask is formed in accordance with a shape of the partition wall and the resist is exposed and developed by using the mask. Accordingly, the resist remains in the shape of the partition wall. Finally, etching is performed to remove the partition wall material in an area other than the mask. The partition wall may be composed of more than one layer. For example, a lower layer is made of inorganic substance and an upper layer is made of organic substance.

Figure 5B:
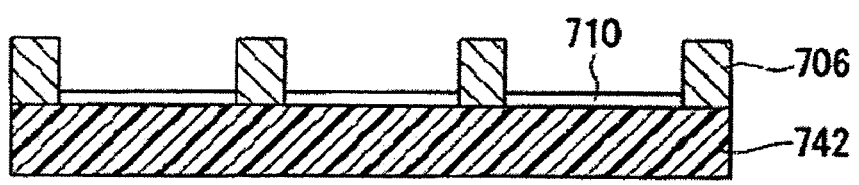

Subsequently, the lyophilic layer 710 is formed on the substrate 742 as shown in FIG. 5B. Here, a titanium oxide dispersion liquid (lyophilic liquid, ST-K211, produced by Ishihara Sangyo Kaisha, Ltd) in which particles of lyophilic titanium oxide are dispersed in alcohol is applied to the whole surface all at once by the spin coating.

As for the titanium oxide particle, an average size of the particle is preferably 1-500 nm, particularly, 5-100 nm. As the dispersion medium, alcohol kinds such as methanol, ethanol, i-propanol, n-propanol, n-butanol, i-butanol, t-butanol, methoxyethanol, ethoxyethanol, ethylene glycol and the like can be named. More than one above-metnioned substances may be combined to be used.

This titanium oxide dispersion liquid in 0.2 wt % concentration is applied to the substrate 742 by the spin coating with 500 rpm.

Because the partition wall 706 has the lyophobic quality and centrifugal force works by the spin, the titanium oxide dispersion liquid applied to the whole surface of the substrate 742 is shed and introduced into the filter element forming region 707 which is the picture element part. Furthermore, since the dispersion liquid employs the alcohol as the dispersion medium, the titanium oxide dispersion liquid is evaporated and dried as soon as it is introduced into the filter element forming region 707, and then formed as a transparent layer.

Figure 5C:
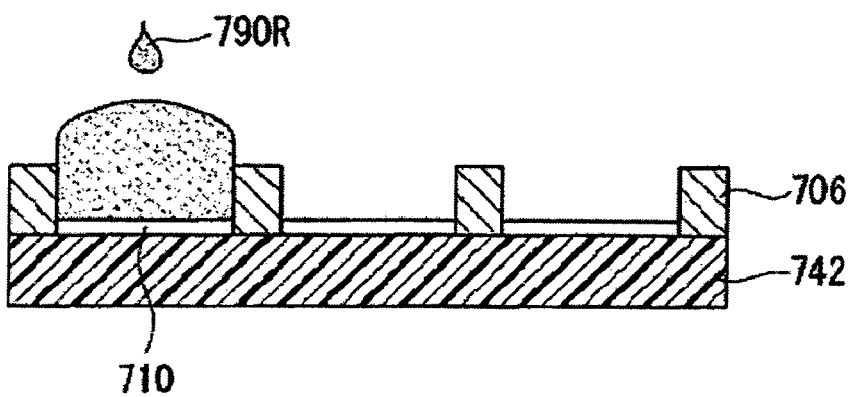
Figure 7A:
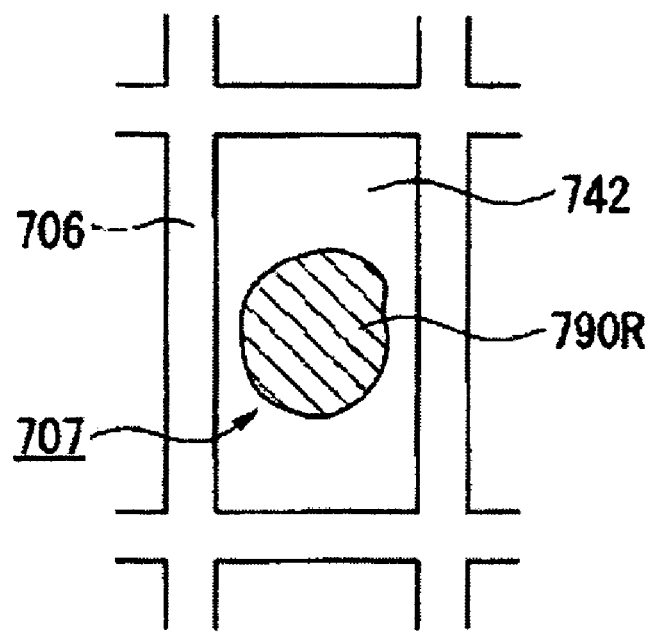
FIGS. 7A and 7B are explanatory drawings for explaining the way a droplet landed in a filter element forming region spreads out.
Figure 7B:
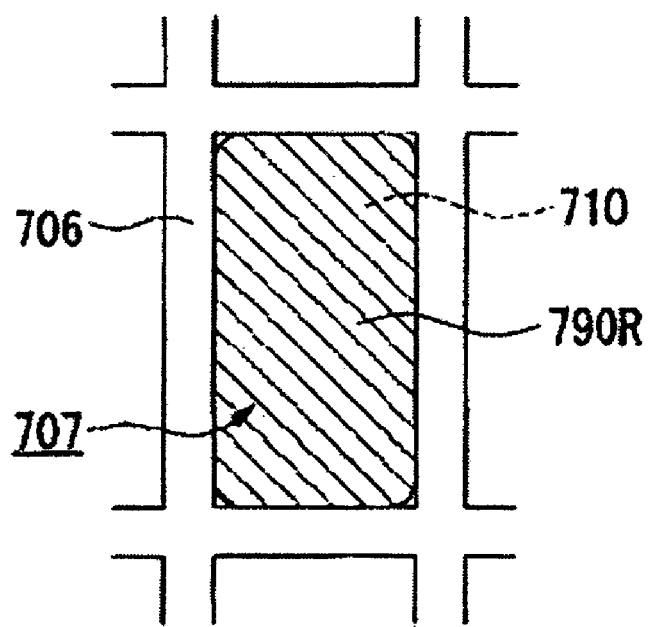

Next, a red (R) droplet 790R is discharged and the droplet arrives at the lyophilic layer 710 on the substrate 742 as shown in FIG. 5C. Here, if the lyophilic layer is not formed in the filter element forming region 707 and the droplet 790R lands in the substrate 742, a contact angle in the substrate 742 is about 30° and the droplet 790R will not be well spread as shown in FIG. 7A. On the contrary, if the droplet 790R lands in the lyophilic layer 710 like this embodiment, the contact angle in the substrate 742 is equal to or smaller than 5°. Therefore, the droplet will spread widely so as to cover the substantially whole surface of the filter element forming region 707 as shown in FIG. 7B by discharging a larger amount of droplet than a certain level.

Figure 6D:
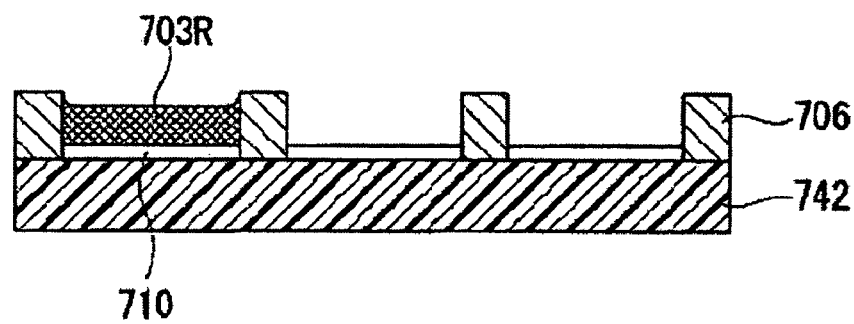
FIGS. 6D through 6F are schematically showing the manufacturing method of the liquid crystal device.
Figure 6E:
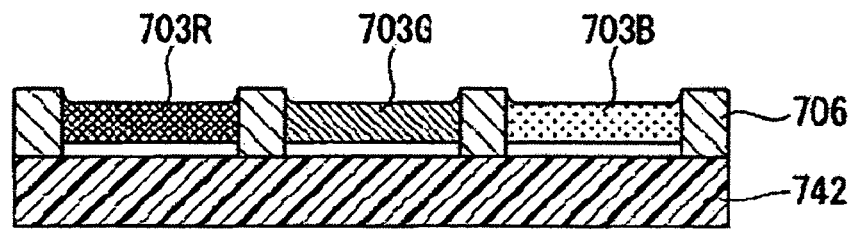

The amount of the droplet 790R that is discharged to the filter element forming region 707 should be sufficient amount in consideration of volume decrease of the liquid at the time of a heating process. Subsequently, a soft calcination of the liquid is performed and the colored layer 703R is formed as shown in FIG. 6D. The above-described process is repeated with respect to each color R, G and B and the colored layers 703G and 703B are sequentially formed as shown in FIG. 6E. After all the colored layers 703R, 703G and 703B are formed, the colored layers 703R, 703G and 703B are burnt together.

Figure 6F:
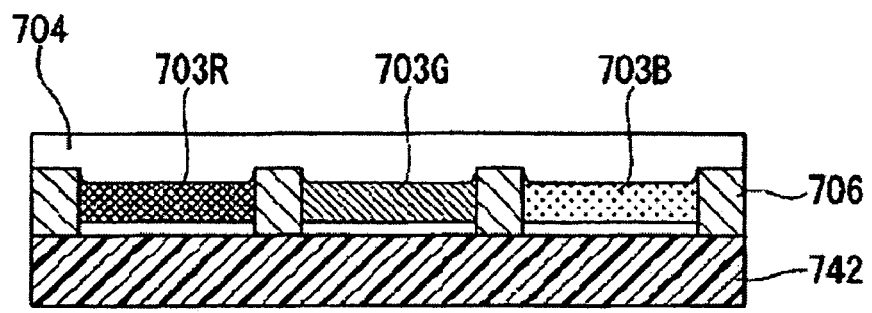

Next, the substrate 742 is planarized and an over coat film 704 (protection film) is formed so as to cover each colored layer 703R, 703G and 703B and the partition wall 706 as shown in FIg. 6F in order to protect the colored layers 703R, 703G and 703B. to form this protection film 704, the spin coat method, the roll coat method, a ripping method and the like may be adopted. In the same way as forming the colored layers 703 R, 703G and 703B, the droplet discharging process may also be adopted to form the protection film 704.

As described above, according to the embodiment, it is possible to spread the droplet of the colorant on the filter element forming region 707 even if the substrate 742 is not trated to have the lyophilic quality since the colorant is discharged to the filter element forming region 707 where the lyophilic layer 710 is formed. Consequently, it is possible to obtain the flat and uniform colored layer.

Furthermore, according to the embodiment, it is possible to form the lyophilic layer 710 more easily and swiftly with simple equipment because the titanium oxide dispersion liquid is applied by the spin coat method. As a result, it is possible to improve the production efficiency.

Moreover, according to the embodiment, there is no need to separately have a process to give the lyophilic quality such as the plasma treatment because the lyophilic layer 710 is made of the lyophilic titanium oxide. Consequently, it is possible to further improve the production efficiency. In addition, according to the embodiment, there is no need to have the plasma treatment for giving the lyophobic quality to the partition wall 706 since the partition wall 706 is made of the lyophobic material. Thereby, it is possible to improve the production efficiency and contribute to global environmental protection.

Furthermore, according to the embodiment, the lyophilic layer 710 is formed after the partition wall 706 is formed on the substrate 724 and the lyophilic layer 710 is divided. Therefore, unlike the case where the partition wall is formed after the lyophilic layer 710 is formed, the colorant will not leak though the lyophilic layer to the other filter element forming region 707 and it is possible to prevent the trouble of the color mixture from happening.

As for the liquid crystal device, the invention can also be applied to a reflective type panel and a transflective type panel in addition to a transmissive type panel.

(Electronic Equipment)

FIGS. 8A through 8C show embodiments of electronic equipment according to an aspect of the invention. The electronic equipments of the embodiments have the liquid crystal devices having the color filters according to the aspect of the invention as display means.

FIG. 8A is a perspective view of a mobile phone as an example. In FIG. 8A, reference numeral 1000 refers to a body of the mobile phone and reference numeral 1001 refers to a display part in which the above-described liquid crystal device is employed.

FIG. 8B is a perspective view of watch type electronic equipment as an example. In FIG. 8B, reference numeral 1100 refers to a body of the watch (electronic equipment) and reference numeral 1101 refers to a display part in which the above-described liquid crystal device is employed.

FIG. 8C is a perspective view of a potable information-processing device such as a word processor and a personal computer as an example. In FIG. 8C, reference numeral 1200 refers to the information-processing device (electronic equipment), reference numeral 1202 refers to an input unit such as a keyboard, reference numeral 1204 refers to a body of the information-processing device, and reference numeral 1206 refers to a display part in which the above-described liquid crystal device is employed.

The electronic equipments showed in FIGS. 8A through 8C have the liquid crystal devices according to the aspect of the present invention as a display means. Therefore, it is possible to obtain electronic equipment with a high visibility and in which a microscopic patterning with a high-resolution is possible.

Although the embodiments of the invention have been fully described by way of example with reference to the accompanying drawings, it is to be understood that the embodiments described hereunder do not in any way limit the scope of the invention. Configuration or combination of the above-mentioned members in the embodiments is just an example, and various changes and modifications will be applied within the scope and spirit of the present invention in compliance of demands.

For example, though the partition wall 706 is made of the lyophobic material in the above-described embodiment, the case is not limited to this. An organic material which is capable of acquiring the lyophobic quality by the plasma treatment, has a good adhesion to a base substrate and is easily patterned by the photolithography can also be used. As such organic material, for example, organic polymeric material such as acrylic resin, polyimide resin, polyamide resin, polyester resin, olefin resin and melamine resin can be named. Inorganic polymeric material such as polysilane, polysilazane and polysiloxane can also be used to form the partition wall. After forming the partition wall with the above-mentioned material, the lyophobic quality can be given by the plasma treatment ($CF_4$ plasma treatment) using tetrafluoromethane as a treatment gas in the atmospheric pressure.

Furthermore, though the lyophilic layer 710 is made of the lyophilic titanium oxide in the above-described embodiment, the case is not limited to this. When a material having a photocatalytic feature such as the titanium oxide is irradiated with a high energy light such as ultraviolet rays, polarity is given to its surface by conduction electron and electron hole generated from photoexcitation. Water is chemically absorbed in a form of hydroxyl function (OH—) and a physical adsorption water layer is further formed thereon. Consequently, the surface becomes super lyophilic. Therefore, the higher lyophilic quality may be given to the lyophilic layer by irradiating the substrate 274 with the ultraviolet ray.

Meanwhile, because of the photocatalytic feature of the titanium oxide and the like, for example, the colored layers 703R, 703G and 703B could receive adverse effect at the time of the ultraviolet ray irradiation. Therefore, it is preferable that an ultraviolet filter is provided to the substrate 724 in order to prevent the ultraviolet ray from entering into the lyophilic layer 710. In this case, the ultraviolet filter may be provided outside the polarization plate 716a shown in FIG. 2 or between the retardation plate 715a and the substrate 724.

Though the titanium oxide dispersion liquid is applied to the substrate 724 all at once by the spin coat method in the above-described embodiment, the lyophilic layer may be formed by a dipping method.

Though the active matrix type liquid crystal device is described as an example in the above-described embodiment, the aspect of the invention can also be applied to a passive matrix type liquid crystal device.

Furthermore, as a formation pattern of the filter element forming region 707, a strip type is shown in the figure. However, a mosaic type, a delta type and a square type may also be adopted in addition to the strip type.

Though coloration of the filter element forming region 707 is RGB in the embodiment, the case is not limited to this. YMC is also applicable. Y stands for yellow, M stands for magenta and C stands for cyan.

What is claimed is:

1. A method for manufacturing a color filter having a picture element part surrounded by a partition wall and provided in the plural number on a substrate, comprising:
    forming the partition wall that has a lyophobic quality on the substrate;
    forming a lyophilic layer in the picture element part by applying a lyophilic liquid that develops the lyophobic quality to a whole surface of the substrate on which the partition wall has been formed all at once; and
    applying a droplet of colorant to the picture element part in which the lyophilic layer is formed.

2. The method for manufacturing a color filter according to claim 1, wherein the lyophilic liquid is applied to the substrate all at once by a spin coat method.

3. The method for manufacturing a color filter according to claim 1, wherein the lyophilic liquid includes a particle made of at least one substance selected from the group consisting of silica, titanium oxide, zinc oxide, tin oxide, strontium titanate, tungsten oxide, bismuth oxide and iron oxide.

4. The method for manufacturing a color filter according to claim 3, wherein the particle included in the lyophilic liquid has an average particle size of equal to or less than 1.0 µm.

5. The method for manufacturing a color filter according to claim 3, further comprising:
    developing the lyophilic quality in the lyophilic layer by performing a plasma treatment to the substrate.

6. The method for manufacturing a color filter according to claim 3, further comprising:
    forming an ultraviolet filter on the substrate.

7. A color filter manufactured by the method for manufacturing a color filter according to claim 1.

8. An electrooptical device comprising the color filter according to claim 7.

9. Electronic equipment comprising the electrooptical device according to claim 8.

* * * * *